United States Patent [19]

Gay

[11] 3,750,041

[45] July 31, 1973

[54] ACTIVE BOOTSTRAP CIRCUIT

[75] Inventor: Michael J. Gay, Scottsdale, Ariz.

[73] Assignee: Motorola, Inc., Franklin Park, Ill.

[22] Filed: Feb. 17, 1972

[21] Appl. No.: 227,173

[52] U.S. Cl. ........................ 330/26, 330/28, 330/32, 330/38 M, 330/110, 330/112, 330/156

[51] Int. Cl. .............................................. H03f 1/38

[58] Field of Search ................... 330/26, 28, 32, 85, 330/110, 112, 93, 95, 38 M, 156; 328/176

[56] References Cited

UNITED STATES PATENTS

| | | | |
|---|---|---|---|
| 3,582,801 | 1/1971 | Hansen | 330/26 |
| 2,744,169 | 5/1956 | Deming | 330/110 X |
| 3,169,228 | 2/1965 | Sinniger | 330/26 X |
| 3,447,092 | 5/1969 | Hoke | 330/26 X |

OTHER PUBLICATIONS

Davidson, "Transistor AC Amplifier with High Input Impedance" Semiconductor Products, March, 1960, pp. 42–47.

*Primary Examiner*—Roy Lake
*Assistant Examiner*—James B. Mullins
*Attorney*—Vincent Rauner et al.

[57] ABSTRACT

A high input impedance linear amplifier is disclosed. The amplifier circuit has an input impedance resistance which is designed for proper DC biasing, but is too low to accommodate an AC input from a high impedance source. The circuit, through a voltage divider and a semiconductor, effectively provides a very high dynamic impedance to the incoming AC signal.

8 Claims, 3 Drawing Figures

ACTIVE BOOTSTRAP CIRCUIT

BACKGROUND OF THE INVENTION

The invention pertains to linear amplifiers and particularly to those amplifiers which employ semiconductive devices and are fabricated as integrated circuits. The circuit of this invention serves particularly well as an input circuit for high impedance devices such as crystals that may be used in phonograph pickup arms and the like.

The prior art has dealt with the problem of providing a dynamic high input impedance in a circuit having an unacceptably low input impedance by employing a large capacitor to reflect a voltage back to the low value input resistance provided, so that the voltage across it is minimal, thus reflecting a very high input impedance. This technique lends itself nicely to discrete circuits, but not well to integrated circuits. Capacitors of the size required for this application cannot be practically fabricated within an integrated circuit structure. The circuit of this invention provides very high dynamic input impedance without using the capacitor, and fabricated completely as an integrated circuit.

An object of this invention, therefore, is to provide a high input impedance amplifier in an integrated circuit form.

Another object of this invention is to provide high dynamic input impedance for an amplifier using only resistive and semiconductive devices.

Still another object is to provide an amplifier whose dynamic input impedance can be simply approximated.

These and other objects will be explained in the detailed description that follows.

BRIEF SUMMARY OF THE INVENTION

The linear amplifier of the preferred embodiment described herein is implemented in integrated form. The amplifying transistor employed is of an inherent, low impedance input type. The input of the amplifier is connected to the crystal of a phonograph pickup arm having a very high impedance. To avoid degrading the signal from the crystal, it must be directed into a very high impedance.

The amplifier is provided with an input resistor whose value is determined by the DC biasing requirements of the amplifying transistor. This invention is intended to make the input impedance to the signal from the crystal seem very large.

A current amplifier is connected from the collector of the amplifying transistor to its emitter. It inverts the signal from the collector of the amplifying transistor and feeds the inverted signal back to the emitter where it exactly tracks the crystal signal present on the base, the amplitude of the fed-back signal being such that there is, for practical purposes, no voltage drop between the base and the emitter of the amplifying transistor. A simple voltage divider network is connected from the emitter to a voltage reference with a connection being made from a point on the voltage divider to the input resistor via a diode-connected transistor. Assuming a negligible dynamic base-to-emitter voltage drop in the diode-connected transistor, the voltage across the input resistor is equal to the voltage from the emitter of the amplifying transistor to the voltage divider terminal. The very low dynamic voltage drop seen across the input resistor therefore makes the signal from the crystal react as to a true high impedance input.

DETAILED DESCRIPTION OF THE INVENTION

Figure 1:
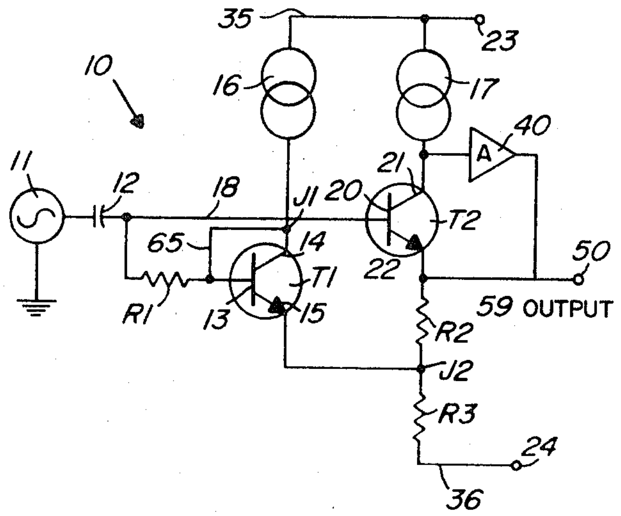
FIG. 1 is a partial block, partial schematic diagram of the high input impedance amplifier of this invention.

Referring first to FIG. 1, the amplifier 10 has a high impedance input 11 coupled by way of capacitor 12. The high impedance input 11, in the preferred embodiment, represents the output of a crystal of a phonograph pickup arm, but could be any high impedance input. Amplifying transistor T2 is shown with its base 20 connected to input capacitor 12, its collector 21 connected to current source 17, and its emitter 22 connected to resistor R2. To fully appreciate the distinction from the prior art, reference should now be made to FIG. 2.

Figure 2:
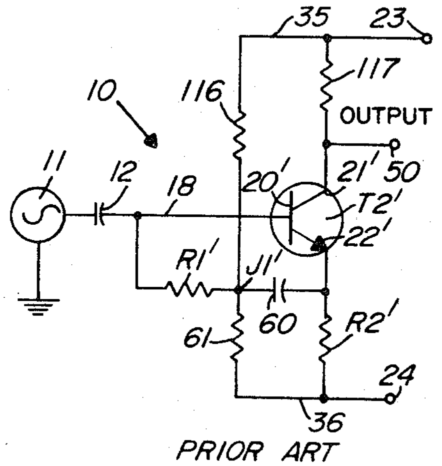
PRIOR ART FIG. 2
FIG. 2 is a schematic representing a prior art high input impedance amplifier.

FIG. 2 also illustrates a high impedance input source 11 connected to amplifier 10 by way of coupling capacitor 12. Input impedance resistor R1' is connected at one end to coupling capacitor 12 by way of input conductor 18 and at the other end to one side of a "Bootstrap" capacitor 60. Coupling capacitor 12 is connected to the base 20 of amplifying transistor T2' whose collector 21' is connected to a positive source of voltage 23 by way of resistor 117. Transistor T2' as shown is an NPN type.

The emitter 22' is connected through resistor R2' to a negative supply voltage and also to the other side of "Bootstrap" capacitor 60. Resistor 116 is connected at one end to positive terminal 23 and at the other to junction J1'. Biasing resistor 61 is shown connected at J1' and to negative terminal 24 through conductor 36.

In general, the circuit of FIG. 2 has an input impedance resistor R1' which is of appropriate value to aid in the biasing of amplifying transistor T2', but is too small as an input impedance to the high impedance source 11. The input signal develops an AC component voltage across input resistor R1' and also across feedback resistor R2'. The AC voltage developed across R2' is transferred to junction J1' by way of "Bootstrap" capacitor 60. That voltage subtracts from the AC component of voltage developed across R1' so that the total current through R1' becomes much smaller and as a result the loading presented by this amplifier circuit is substantially reduced. The capacitance of "Bootstrap" capacitor 60 must be quite large. At the present state of the art, it is impractical to fabricate such a capacitor as an integral part of an integrated circuit. It could be fabricated as a discrete component and attached to the amplifier in integrated circuit form, but this would require two extra connections to be made to the integrated circuit and the packaging would not be as compact and convenient as if the "Bootstrap" capacitor were part of the integrated circuit.

Referring again to FIG. 1, a diode-connected transistor T1 is shown, replacing "Bootstrap" capacitor 60 of FIG. 2. The base 13 of transistor T1 is shown connected to junction J1, as is the collector 14. The emitter 15 of transistor T1 is connected to junction J2. Input resistance R1 is shown connected at one end to coupling capacitor 12 by way of input line 18 and at the other end to junction J1. Positive voltage source 23 is connected to current source 16 by way of conductor 35, current source 16 being connected to junction J1. Current source 17 is shown also connected to positive voltage source 23 and also to the collector 21 of amplifying transister T2. The emitter 22 of transistor R2 is connected through resistor R2 to junction J2, and then through resistor R3 to negative voltage source 24. Current amplifier 40 is connected at its input to the collector 21 of transistor T2 and at its output to emitter 22. The output of current amplifier 40 is also connected to output terminal 50.

Figure 3:
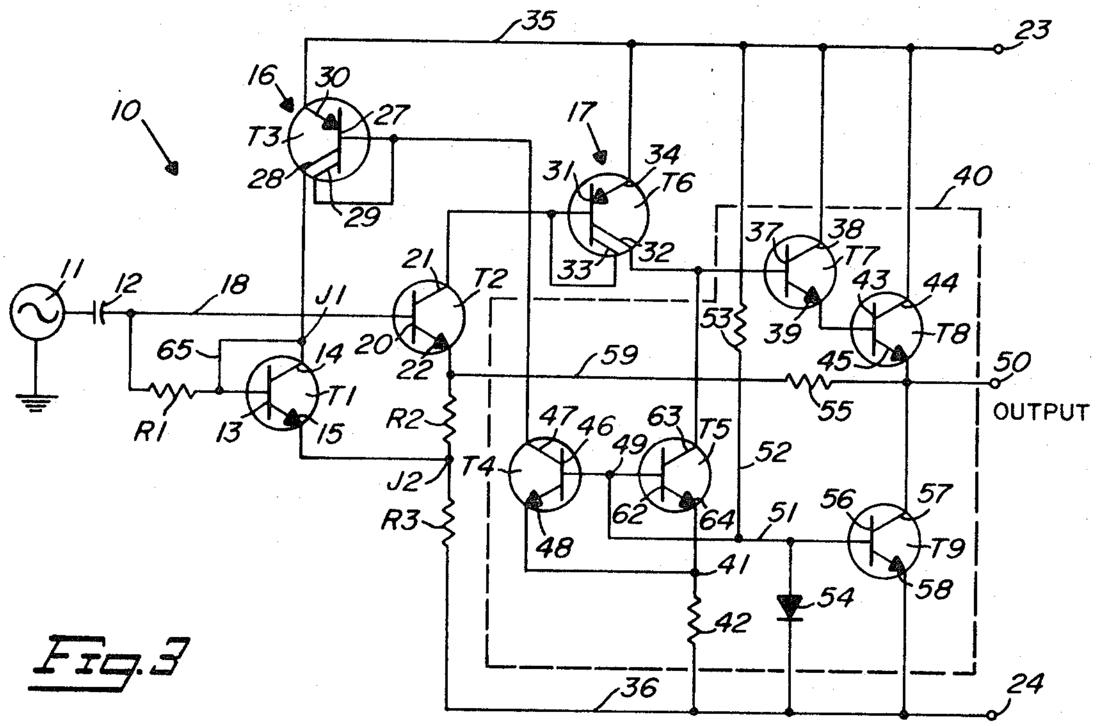
FIG. 3 is a schematic diagram of the high input impedance amplifier of this invention.

FIG. 3 augments FIG. 1 by showing the detail of current amplifier 40 and current source 16. Current source 17 is replaced in the preferred embodiment of FIG. 3 by providing transistor T5 and transistor T6 in conjunction with transistor T2 itself, to provide a prescribed current through transistor T2. This combination of transistors T5 and T6 is referred to as a current control. Amplifier 40 is not an absolute requirement to make this invention operable, but as will be described later, it enhances the operation. Likewise, current source 16 as described herein, need not be of the preferred embodiment type — indeed it could be a very large resistor and not a current source at all. However, the operation is enhanced by the current source employed.

Current source 16 is a split collector, lateral PNP transistor T3 whose emitter 30 is connected through conductor 35 to the positive voltage terminal 23 and whose first collector 28 is connected to junction J1. The second collector 29 of transistor T3 is connected to base 27 which is connected to collector 47 of transistor T4. Transistor T6 is a split collector, lateral PNP transistor whose emitter 34 is connected to positive voltage terminal 23 via conductor 35 and whose first collector is connected to the collector 63 of transistor T5 and to the base 37 of transistor T7. The second collector 33 of transistor T6 is connected to the base 31 of transistor T6 which is connected to the collector 21 of amplifying transistor T2. The base 46 of transistor T4 and the base 62 of transistor T5 are joined together at junction 49 and bias thereto is provided from positive voltage terminal 23 across resistor 53 through conductor 52, this bias being also connected via conductor 51 to the base 56 of transistor T9.

Diode 54 is forward biased between positive terminal 23 and negative terminal 24 and its anode is connected to junction 49 of the base 46 of transistor T4 and the base 62 of transistor T5, and to the base 56 of transistor T9 to maintain an equality of potential when thermal effects tend to cause relative drifting.

Emitter 48 of transistor T4 and emitter 64 of transistor T5 are connected together at junction 41 with common emitter resistor 42 connected at one end to junction 41 and at the other end to conductor 36, and thence to negative voltage terminal 24. Transistors T4 and T5 draw equal, relatively small currents. This close matching of transistors T4 and T5, and all other components in an integrated circuit is inherent in the manufacturing technique.

Transistor T4, together with the common emitter resistor 42, established the current supplied by transistor T3 of current source 16. Likewise, the current control transistor T5 and common emitter resistor 42 establish the current supplied through transistor T6 by transistor T2. The current conducted by transistor T4 is inverted in the collector 28 of transistor T3 to complete the circuit through diode-connected transistor T1. The connections described in detail above result in an overall feedback which causes the amplifying transistor T2 to conduct the necessary current by way of the base of transistor T6. In the preferred embodiment, the ratio of the current $i_2$ flowing through the collector of diode-connected transistor T1 to the current $i_3$ flowing through the collector 21 of amplifying transistor 22 is approximately unity.

The split collector, lateral PNP transistor, of the type of T3 and T6 is commonly used in current source circuits and is well known. Briefly, the split collectors draw equal currents. By connecting one collector to the base, a collector current is established and the other collector tends to conduct an equal amount of current in the load circuit.

The collector 38 of transistor T7 is connected to the positive voltage terminal 23 by way of conductor 35 and the emitter is connected to the base 43 of transistor T8. The collector 44 of transistor T8 is also connected to the positive voltage terminal 23 and its emitter is connected to the junction of output resistor 55 and output terminal 50. The combination of transistors T7 and T8 provides the well known Darlington configuration which in turn provides for current gain through resistor 55 and conductor 59 to emitter 22 of transistor T2. Transistor T9 provides a bias current for transistor T8. The collector 57 of transistor T9 is connected to the emitter 45 of transistor T8 and the emitter 58 is connected to the negative voltage source 24 by way of conductor 36.

MODE OF OPERATION

Assume an AC signal (Vin) coming from high impedance source 11 by way of coupling capacitor 12 via input line 18 to the base 20 of transistor T2. The signal is inverted at the collector 21 of amplifying transistor T2 and is inverted again at collector 32 of transistor T6. The signal is current amplified through the Darlington pair, transistors T7 and T8, and is fed back through resistor 55 to the emitter 22 of amplifying transistor T2. The signal appearing at 22 is essentially in phase with the input signal appearing at the base 20. The amplitude of the signal fed back at emitter 22 matches closely that of input signal at the base 20 so that the dynamic base-to-emitter dopp of transistor T2 can be ignored. Assuming a negligible base-to-emitter dynamic voltage drop through diode-connected transistor T1, it can be seen that the dynamic voltage appearing across R1 and T1 (V1) is equal to the dynamic voltage (V2) appearing across resistor R2. Vin has been applied to the base 20 of transistor T2 and, as explained above, essentially appears at emitter 22 across resistors R2 and R3. Therefore, the voltage across R2 is defined by the equation:

$$V2 = (R2/R2{+}R3).\ \mathrm{Vin}$$

The dynamic input impedance can be expressed by the equation:

$$\mathrm{Zin} = V\mathrm{in}/i_1$$

$$i_1 = V1/R1$$

$$V1 = V2$$

Therefore, $$i_1 = [Vin\ (R2/R2+R3)]/R1$$

Substituting:

$$Zin = R1\ (R2+R3/R2)$$

Zin is a dynamic impedance which is the ohmic value of the input impedance resistor $R1$ multiplied by $1+R3/R2$. This multiplier, known as the "Bootstrap" factor, can be very large, depending of course, on the over-all circuit design. In the preferred embodiment, the "Bootstrap" factor is 25 and the dynamic input impedance (Zin) is 750K ohms.

To establish the quiescent operating voltages, the emitter area of amplifying transistor T2 is made five times larger than that of diode-connected transistor T1. This difference in area results in a difference between the base-emitter voltage drop of typically 42 mV. A voltage drop in the order of 2 mV occurs across T1 leaving 40 mV (corresponding to a 6V potential at output 50) to be accomodated across $R2$. These results are achieved using a positive supply voltage of +12V and the following values of resistance:

| | | | |
|---|---|---|---|
| R1 | 30K ohm | 42 | 8K ohm |
| R2 | 40 ohm | 53 | 10K ohm |
| R3 | 960 ohm | 55 | 5K ohm |

Those skilled in the art appreciate that the parameters and constraints set out above are representative only of the preferred embodiment and that, of course, they can be changed without departing from the spirit and scope of this invention. For example, a major source of error in this circuit could occur because of the voltage drop across $R1$ due to the base current of transistor T2. To remedy this, a resistor ($R4$) may be inserted in place of conductor 65 from junction J1 to the base 13 of transistor T1. With the current gains of transistor T1 and T2 closely matched, the resistor $R4$ is given the value:

$$R4 = R1\ i_3/i_2$$

Then the voltage developed across R4 due to the base current of transistor T1 will closely match that developed across R1 due to the base current of transistor T2. The error due to the latter will thus be substantially cancelled.

It is an additional benefit of the circuit described that the bias conditions are defined by the fundamental semiconductor junction characteristics and by the ratio of $i_2$, $i_3$ and the ratio of emitter areas of transistor T1 and transistor T2. In particular, the absolute values of $i_2$ and $i_3$ need not be closely controlled. Since these currents must normally be small to minimize the voltage drop due to the base current flowing through resistor $R1$, this is a significant advantage. It is simpler to make two small currents hold a particular ratio than to define one absolutely. It also follows from the above description that the bias conditions are independent of the supply voltage.

I claim:

1. A high input impedance integrated circuit amplifier having input means for receiving an input alternating current signal, and output means for supplying an output alternating current signal, comprising:

a. current source means;

b. a transistor having at least first and second main electrodes and a control electrode, the first main electrode being connected to the current source means and the control electrode being connected to the input means to permit the transistor to be responsive to the input signal;

c. input impedance means, connected at one end to the input means, and at the other end to a first junction with the current source means;

d. voltage dividing means, connected to the second main electrode of the transistor at one end and to a voltage source at the other end, having at least one terminal at a second junction for supplying a pre-determined portion of the voltage across the dividing means; and e. unilateral semiconductive voltage transfer means for transferring the voltage at the second junction to the first junction to effectively increase the dynamic input impedance.

2. The invention of claim 1 further comprising:

f. negative feedback means having an input terminal connected to the first main electrode of the transistor and an output terminal connected to the second main electrode of the transistor for providing an alternating current signal at the second main electrode in phase with the alternating current signal on the control electrode to minimize the control electrode current.

3. The invention of claim 2 wherein the current source means further comprise a first constant current source connected to the first main electrode of the transistor and a second constant current source connected to the first junction.

4. The invention of claim 2 wherein the current source means further comprise a current control connected to the first main electrode of the transistor and a constant current source connected to the first junction.

5. The invention of claim 1 wherein the unilateral voltage transfer means comprise a diode.

6. The invention of claim 4 wherein the unilateral voltage transfer means comprise a diode-connected transistor.

7. The invention of claim 6 wherein the negative feedback means comprise a current amplifier.

8. The invention of claim 7 wherein the input impedance means comprise a resistor designated $R1$ and the voltage divider means comprise a first resistor designated $R2$, connected between the second main electrode of the transistor and the second junction, and a second resistor, designated $R3$, connected between the second junction and the voltage reference, all operatively connected to approximate the dynamic input impedance designated Zin, in accordance with the equation:

$$Zin = R1\ (R2+R3/R2)$$

* * * * *